(12) United States Patent
Matsuoka

(10) Patent No.: US 7,257,785 B2
(45) Date of Patent: Aug. 14, 2007

(54) METHOD AND APPARATUS OF EVALUATING LAYER MATCHING DEVIATION BASED ON CAD INFORMATION

(75) Inventor: Ryoichi Matsuoka, Chiba (JP)

(73) Assignee: SII NanoTechnology Inc. (JP)

( * ) Notice: Subject to any disclaimer, the term of this patent is extended or adjusted under 35 U.S.C. 154(b) by 352 days.

(21) Appl. No.: 10/823,104

(22) Filed: Apr. 13, 2004

(65) Prior Publication Data

US 2004/0194042 A1 Sep. 30, 2004

Related U.S. Application Data

(62) Division of application No. 10/147,417, filed on May 16, 2002, now Pat. No. 6,757,875.

(30) Foreign Application Priority Data

May 29, 2001 (JP) .............................. 2001-160755

(51) Int. Cl.
*G06F 17/50* (2006.01)
(52) U.S. Cl. ......................................................... 716/4
(58) Field of Classification Search ..................... 716/4
See application file for complete search history.

(56) References Cited

U.S. PATENT DOCUMENTS

| 5,530,372 | A | * | 6/1996 | Lee et al. | ................... 324/758 |
| 6,078,738 | A | * | 6/2000 | Garza et al. | ................... 716/21 |
| 6,493,867 | B1 | * | 12/2002 | Mei et al. | ..................... 716/21 |
| 6,562,638 | B1 | * | 5/2003 | Balasinski et al. | ............ 438/14 |
| 6,757,875 | B2 | * | 6/2004 | Matsuoka | ....................... 716/4 |

* cited by examiner

*Primary Examiner*—Jack Chiang
*Assistant Examiner*—Brandon W. Bowers
(74) *Attorney, Agent, or Firm*—Adams & Wilks

(57) ABSTRACT

An apparatus of evaluating a layer matching deviation based on CAD information of the invention, is provided with means for storing CAD data and a function of displaying to overlap a scanning microscope image of a pattern of a semiconductor device formed on a wafer and a design CAD image read from the storing means and a function of evaluating acceptability of formation of the pattern by displaying to overlap a pattern image of the semiconductor device formed on the wafer and the design CAD image of the pattern, in addition thereto, a function capable of evaluating acceptability of formation of the pattern also with regard to a shape and positional relationship with a pattern formed at a later step by displaying to overlap a design CAD image of the pattern formed at the later step.

9 Claims, 4 Drawing Sheets

21

22

23

24
25
22

23  25  24

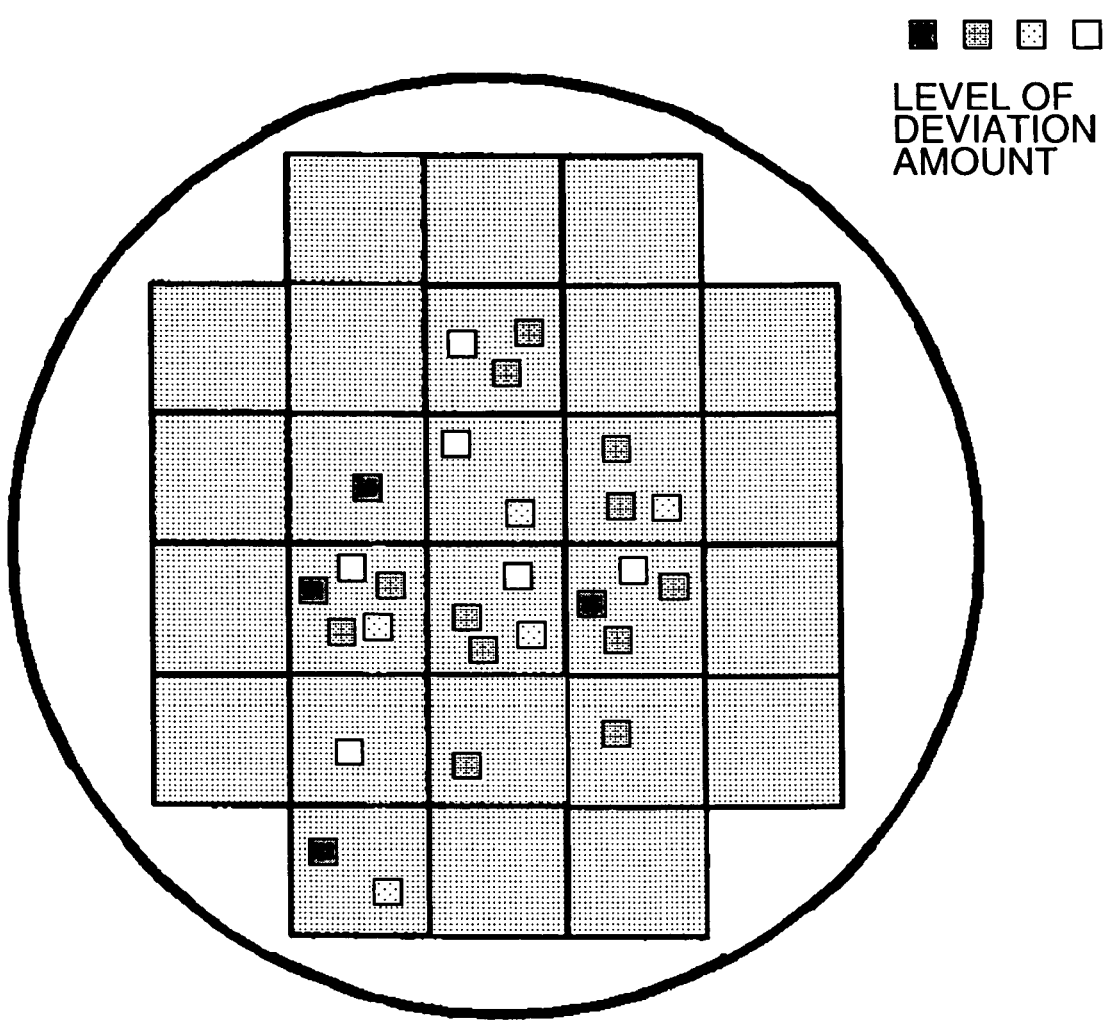

METHOD AND APPARATUS OF EVALUATING LAYER MATCHING DEVIATION BASED ON CAD INFORMATION

CROSS-REFERENCE TO RELATED APPLICATIONS

The present application is a division of application Ser. No. 10/147,417, filed on May 16, 2002, now U.S. Pat. No. 6,757,875, which is hereby incorporated by reference, and priority thereto for common subject matter is hereby claimed.

BACKGROUND OF THE INVENTION

The present invention relates to an apparatus for evaluating layer matching deviation in a step of fabricating a semiconductor device.

In fabricating a semiconductor device (hereafter, abbreviated simply as semiconductor fabrication), first, a pattern of a semiconductor is designed and the pattern is stored as CAD data. Based thereon, a photomask is fabricated and the semiconductor element is not fabricated respectively as a single member thereof but a number of devices are simultaneously fabricated on one semiconductor wafer. Therefore, the photomask is drawn with patterns of a number the same as that of devices fabricated on the one semiconductor wafer. However, when the wafer is printed by the mask simply aligned with the same images, the identical circuit pattern is not photographed at a central portion and a peripheral portion of the wafer. This is because warp is necessarily accompanied by the influence of aberration or like errors of an optical system. Therefore, according to a circuit pattern, there is designed a pattern having a margin anticipating a safety factor in consideration of the aberration of the optical system actually used in transcription such that the circuit becomes normal throughout the transcribed wafer. The transcription of the pattern is executed not only for a single layer, but a plurality of overlapped layers in a thickness direction of the wafer. Further, patterns of different layers are formed by being transcribed by different masks and a circuit is constituted for an individual device and therefore, there is needed a connection among the patterns of the different layers. Therefore, shapes of the patterns among the different masks and positional relationship thereof constitutes an important yield factor in fabricating the semiconductor device. Further, as described above, a number of the devices are formed on the wafer and it is necessary that the shapes of the respective patterns and the positional relationship thereamong, are converged in an allowable range (within margin) of the design standard both at the central portion and the peripheral portion. Particularly, since the large amount of semiconductors are fabricated based on the mask and therefore, finishing accuracy thereof is an important item directly influencing on the yield of the product.

Conventionally, control of the yield dependent upon the shape of the wafer pattern in a step of fabricating a semiconductor device is carried out by using SEM (scanning electron microscope) for length measurement. According to the method, at each step of fabricating steps, the pattern shape is measured by SEM and the shape of the pattern is checked to thereby control the yield. According to the method, the pattern shape can be checked at respective steps, however, matching of a pattern formed at a step thereafter cannot be evaluated and therefore, in this regard, it is the current state that the matching is carried out in synthetic evaluation including pattern failure over steps by electric measurement or the like after finishing a final step. According to evaluation executed after finishing the final step, it is difficult to specify at which portion of which step the failed portion is caused and therefore, there is brought about a situation in which enormous time and labor is taken in a necessary modifying operation.

SUMMARY OF THE INVENTION

The present invention relates to an apparatus for evaluating a layer matching deviation which is capable of determining whether a pattern of a semiconductor device falls in an allowable range of design including a relative positional relationship with a pattern of a later step to be able to carry out instruction to improve yield at an early stage of fabricating a semiconductor device.

An apparatus for evaluating a layer matching deviation based on CAD information of the present invention is provided with means for storing CAD data and a function of displaying an overlapped image of a scanning microscope image of a pattern of a semiconductor device formed on a wafer and a CAD image used to fabricate the device read from the storing means and a function of evaluating acceptability of formation of the pattern by displaying an overlapped image of a pattern image of the semiconductor device formed on the wafer and the CAD image of the pattern, and, in addition thereto, is capable of evaluating acceptability of formation of the pattern also with regard to a shape and positional relationship with a pattern to be formed at a later step by displaying an overlapped image of a CAD image of the pattern to be formed at the later step.

BRIEF DESCRIPTION OF THE DRAWINGS

FIGS. 1A-1C show a high magnification microscope image of an aimed pattern in which FIG. 1A shows a pattern image formed on a wafer, FIG. 1B shows a CAD image of the pattern and FIG. 1C shows to overlap the two images on a display.

FIGS. 2A-2B show a high magnification microscope image of an aimed pattern in which FIG. 2A shows a CAD image displayed by overlapping a pattern to be formed at a successive step or thereafter to the aimed pattern and FIG. 2B shows a CAD image formed in FIG. 2A to overlap on a formed pattern at a current time point on the display.

FIG. 5 is a diagram showing an example of displaying a result evaluated by the invention as a wafer map.

DESCRIPTION OF THE REFERENCE NUMERALS AND SIGNS

Figure 1A:
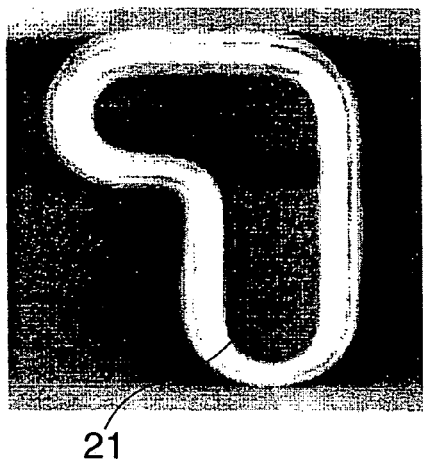

1 Navigation apparatus, 11 CAD apparatus, 12 CAD storing portion, 13 Pattern image data acquiring portion, 14 Image memory, 15 Edge sampling portion, 16 CAD line segment cutting portion, 17 Buffer memory, 18 Comparing and matching portion, 19 Stage position correcting portion, 2 Stage, 3 Pattern observing apparatus (display), 4 Sample (wafer), 7 Position controlling unit, S1, S11, D1, D2, D3 Signals

DETAILED DESCRIPTION OF THE INVENTION

According to an apparatus of observing a wafer pattern for evaluating acceptability of forming a pattern, there is observed a portion of a pattern constituting an observation object disposed within an area of about several through several tens square of microns in a pattern formed on a wafer by enlarging the portion with high magnification and therefore, it is necessary to highly accurately position an observation field of vision of the wafer pattern observing apparatus to a desired observation position on a wafer pattern. Hence, conventionally, as a navigation method for the positioning, there is generally used so-to-speak CAD navigation for specifying the observation object by using a CAD apparatus and by development of a semiconductor fabricating technology in recent years, a dimension of a pattern formed on a wafer becomes a submicron order and in order to observe such an ultra fine pattern, there has been used a wafer pattern observing apparatus having a high magnification of a multiplication factor of several tens of thousands.

According to the invention, there is used a wafer pattern observing apparatus having the CAD navigation function, the apparatus being provided with a function of displaying in an overlapped manner a scanning microscope image of a pattern of a semiconductor device formed on the wafer and a design CAD image read from storing means, wherein the apparatus is not only provided with a function of evaluating acceptability of forming the pattern by displaying the overlapped pattern image of the semiconductor device formed on the wafer and the design CAD image of the pattern, but also a function capable of reading a design CAD image of a pattern formed at a later step by sampling the design CAD image from the storing means and displaying the design CAD image to overlap the current microscope image, thereby, there can be checked and evaluated also a shape and positional relationship of a currently formed pattern and a pattern to be formed in a later step. The invention is characterized in that not only it is possible to check whether a pattern which has already been formed falls in an allowable range of the design pattern but also the shape and positional relationship with a pattern to be formed at a later step can be checked in advance. By enabling a shape defect to be detected at an early point in time, occurrence of a failure thereafter can be prevented beforehand by feeding back improvement instructions to a step of forming a desired pattern. Further, information of the shape defect can be reflected to promotion of yield of a product by feeding forward the information in the form of correcting the position of the pattern in the later step or the like to thereby correct the pattern and can also be reflected to a change in the design of the mask pattern per se. All of the counter measures contribute to promotion of the yield of the device.

Figure 1B:
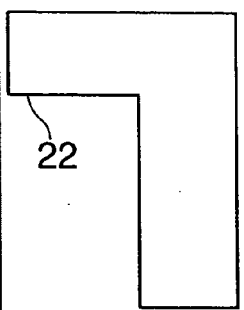
Figure 1C:
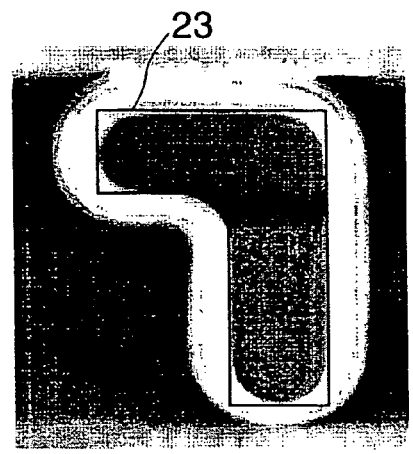
Figure 2A:
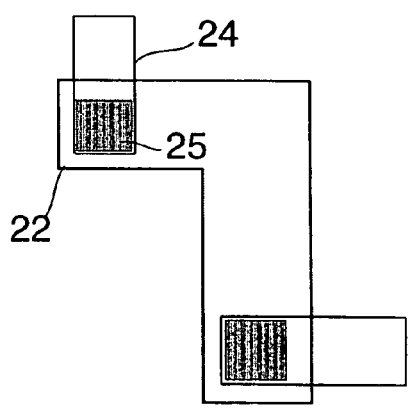
Figure 2B:
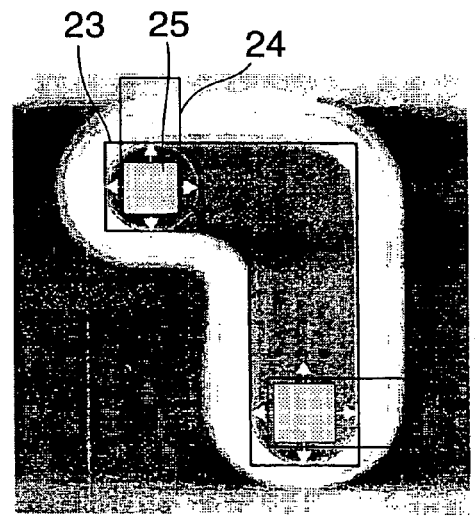

FIG. 1A shows an image of a microscope having high magnification specifying a certain pattern in one chip on a wafer and FIG. 1B shows a CAD image of the pattern. FIG. 1C shows the two images overlapped on a display. Numeral 21 denotes a SEM image of a first metal layer, 22 denotes a CAD image of a first metal layer, 23 denotes an overlapped image of a CAD image and a SEM image. It is found that the pattern image observed in the example matches excellently with the design CAD image although only corner portions thereof are rounded. Further, the phenomenon of rounding the corner portions is a well-known phenomenon in the field of photolithography and the deformation is anticipated from the start. Now, it has been found that the pattern formed in the observation is constituted by a proper shape matching with the CAD image and it is observed by an image shown in FIGS. 2A-2B whether the pattern is proper also in a relationship with a pattern formed in a later step. Numeral 24 denotes a CAD image of a second metal layer, 25 denotes a via layer. FIG. 2A is a CAD image displaying to overlap the pattern to be formed in a successive step and thereafter to an aimed pattern and FIG. 2B shows an image displaying the CAD image of FIG. 2A on a display to overlap onto a formed pattern at a current time point. The pattern adopted in FIGS. 1A-1C and FIGS. 2A-2B, is designed such that a second rectangular metal layer is formed above a metal layer in an L-like shape and a via layer for shortcircuiting the two patterns is formed at end portions of the two metal layers. When observed by FIG. 2B, the CAD image of the second material layer of the later step, overlaps the first metal layer 23 which has already been formed and also a CAD image of the via layer 25 for shortcircuiting the two metal layers is positioned at the area overlapping the two metal layers. It is found that formation of the first metal layer 23 is proper also in the positional relationship with the pattern at the later step.

Figure 3B:
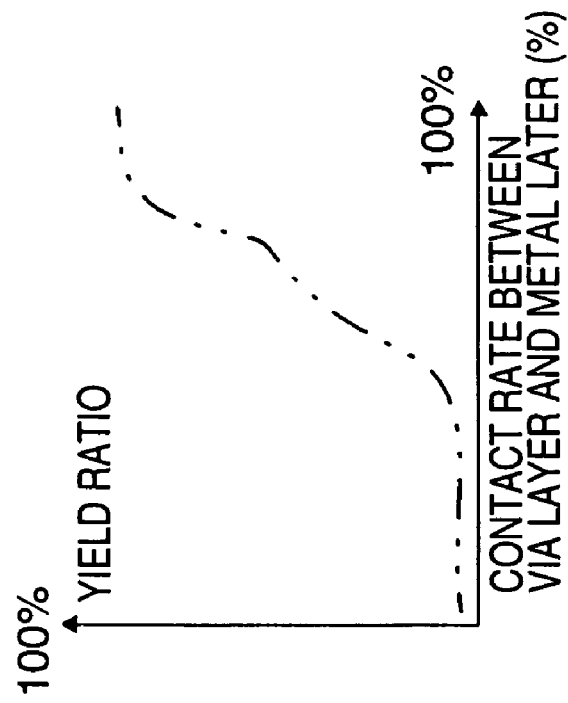
FIG. 3B is a graph showing a corresponding relationship of a rate of bringing the first metal layer and the via layer into contact with each other and yield of the device.
Figure 3A:
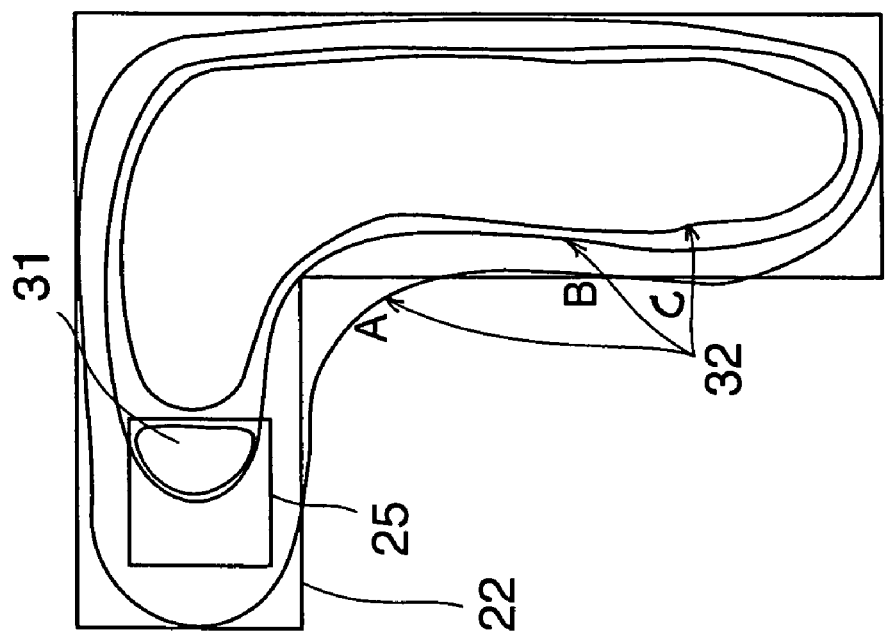
FIG. 3A displays to overlap a CAD pattern of a via layer for shortcircuiting a fist metal layer and a second metal layer and pattern contour lines formed at different chips (A, B, C) and sampled from observation images of the first metal layer

In actual steps of fabricating a semiconductor in which a number of chips are simultaneously fabricated, there is mixed with a chip in which formation of a pattern is improper and there is needed a countermeasure for resolving the improperness. FIG. 3A shows to overlap the CAD pattern of the via layer 25 for shortcircuiting the first metal layer and the second metal layer, and pattern contour lines sampled from observed images of the first metal layer formed at different chips (A, B, C). A first metal layer pattern A is formed as designed and a contact ratio thereof with the via layer is as excellent as 100%. A first metal layer pattern B is formed to be slightly smaller than the design CAD diagram and a contact ratio 31 thereof with the via layer is equal to or smaller than 50%. In the case of a first metal layer pattern C, the pattern is formed to be far smaller than the design CAD diagram and a contact rate thereof with the via layer becomes 0%. In such a case, the first metal layer and the second metal layer cannot be conducted with each other and the chip constitutes a failed device when fabricated as it is. There is recognized a corresponding relationship between yield of the device and the rate of bringing the first metal layer and the via layer in contact with each other and there is established a relationship as shown by FIG. 3B from the data.

Figure 4:
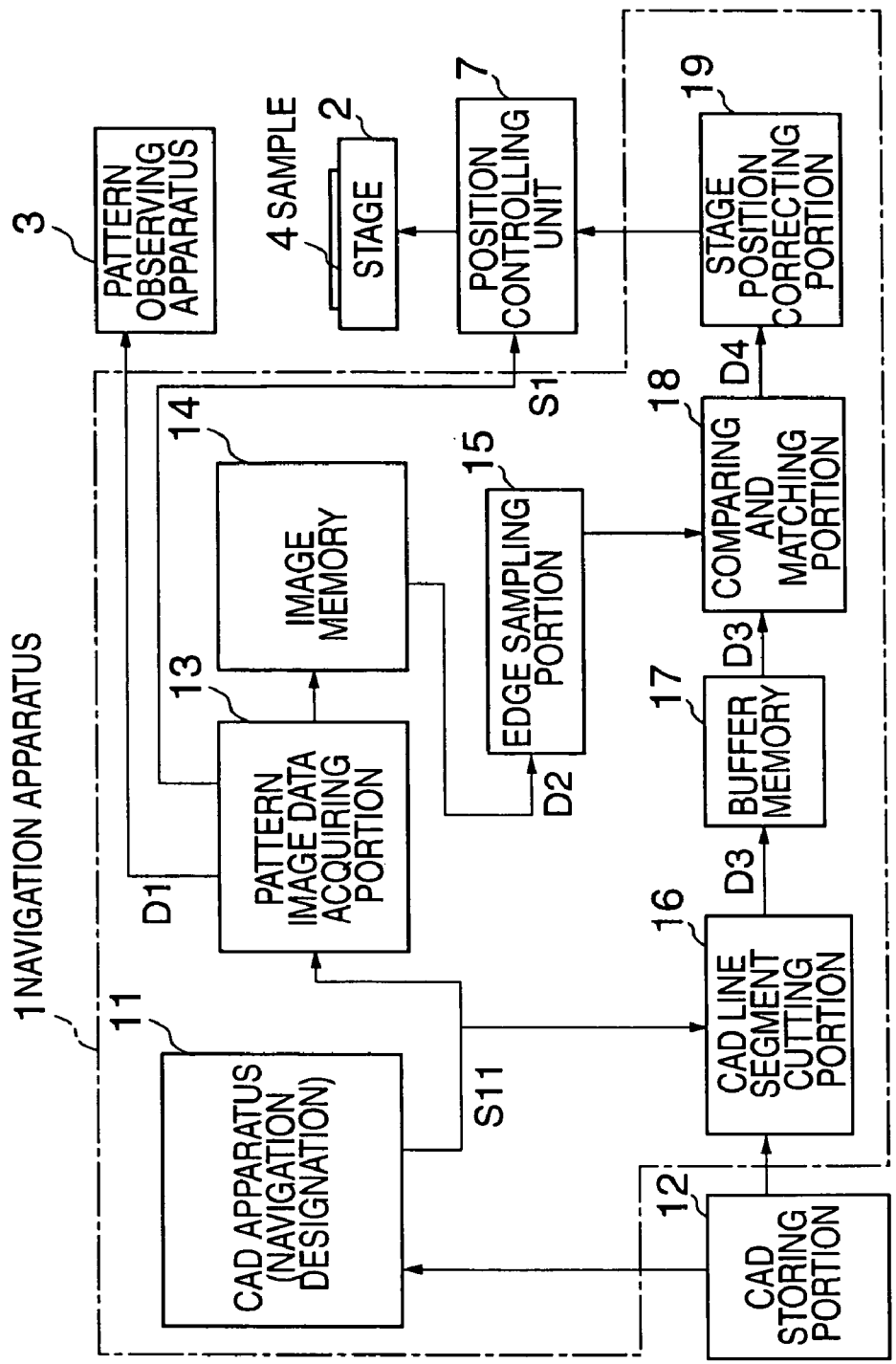
FIG. 4 is a block diagram showing a basic constitution of an apparatus used in the invention.

Next, an explanation will be given of an embodiment and a processing flow of the invention with reference to FIG. 4. FIG. 4 is a block diagram showing a basic layout of an apparatus used in practicing the invention and numeral 1 designates a navigation apparatus for specifying an observation field of vision of a desired position. As the navigation apparatus 1, there is used an apparatus presented in Japanese Patent Application No. 2000-214846, entitled "Navigation method and apparatus for observing pattern of semiconductor apparatus", which was filed previously by the inventors and is incorporated herein by reference. The navigation apparatus comprises designating means for designating a predetermined portion, memory means for storing CAD data in correspondence with a pattern, low magnification pattern image data acquiring means for acquiring low magnification pattern image data of a semiconductor device by matching an observation position of the pattern observing apparatus by low magnification to make a center of observation of the predetermined portion fall in an observation field of vision in response to the designating means, means for outputting edge line segment data by sampling an edge of the pattern based on the low magnification pattern image data, means for providing CAD line segment data in correspondence with the low magnification pattern image data in response to the designating means and the memory means, means for calculating a deviation amount between the center of observation and a center of the observation field of vision by comparing the CAD line segment data and the edge line segment data, and means for executing a position control such that the center of observation and the center of the observation field of vision coincide with each other by compensating for a stage error of a stage based on the deviation amount in order to observe by enlarging the predetermined portion of the pattern of the semiconductor device set to the stage by the pattern observing apparatus while enlarging in a high magnification.

Numeral 11 designates a CAD apparatus for designating navigation and numeral 12 designates a CAD storing portion for storing pattern information. Numeral 13 designates a low magnification pattern image data acquiring portion and when an observing portion is designated from the CAD apparatus 11 constituting the navigation designating portion, in response to a designating signal S11 outputted thereby, the low magnification pattern image data acquiring portion outputs a position setting signal S1 to thereby execute positioning of a sample stage 2. Meanwhile, in response to a magnification setting signal S12, a pattern observing apparatus 3 is set with low magnification and low magnification pattern image data D1 provided by the pattern observing apparatus, is transmitted to the pattern image data acquiring portion 13 and is stored to an image memory 14. Further, at an edge sampling portion 15, based on low magnification pattern image data stored to the image memory 14, there is carried out an edge sampling processing and edge line segment data D2 is outputted.

Meanwhile, at a CAD line segment data cutting portion 16, in response to the designating signal S11 from the navigation designating portion 11, CAD line segment data D3 in correspondence with the designated observation portion, is read from the CAD storing portion 12 and is stored to a buffer memory 17. At a comparing and matching portion 18, there are compared the edge line segment data D2 from the edge sampling portion 15 and the CAD line segment data D3 from the buffer memory 17, a matching processing is executed and a deviation amount of calculated. Deviation amount data D4 indicating a deviation amount provided by the comparing and matching portion 18, is transmitted to a stage position correcting portion 19, at the portion, there is formed a position correcting signal S2 for moving the stage 2 such that a center of observation in the low magnification image and a center of an actual observation field of vision of the pattern observing apparatus 3, coincide with each other and is transmitted to a position control unit 7. Above-described is navigation operation for observing the pattern of a semiconductor device to observe the predetermined position of the pattern of a semiconductor device 4 set to the stage by enlarging the predetermined portion by high magnification by the pattern observing apparatus. By the positioning, a high magnification image of the predetermined portion is caught at a center of a screen and therefore, the magnification of the microscope is changed to high magnification and the invention is executed.

The high magnification image is acquired, transmitted to the pattern image data acquiring portion 13 and is stored to the image memory 14. Further, at the edge sampling portion 15, there is carried out the edge sampling processing based on the high magnification pattern image data stored to the image memory 14 and the edge line segment data D2 is outputted. On the other hand, the CAD segment of the predetermined portion is cut and stored to the buffer memory 17 and therefore, the two line segment images are displayed to overlap by the pattern observing apparatus 3. The positional relationship is accurately matched by the previous navigation and therefore, measurement of the deviation amount is executed on the screen. Further, for example, when the contour line of the first metal layer constituting the edge line segment data, is provided by the contour lines 32 designated by notation A, B or C as shown by FIG. 3A, the aimed pattern is evaluated in accordance with the deviation amount of the CAD line segment image. Further, by overlapping the pattern microscope image as indicated by FIG. 2A, with the CAD image and a CAD image of a related pattern at a successive step, matching of the positional relationship displayed on the pattern observing apparatus 3 is evaluated. Operation of evaluating these is carried out with regard to a predetermined pattern in a specified chip, further, by selecting a pertinent sample chip from a respective area such as a central portion or a peripheral portion on the wafer. A result of evaluation which is carried out for the sample can be displayed on the pattern observing apparatus 3 in a mode of a map display of the wafer as shown by FIG. 5. Incidentally, a rectangle in FIG. 5 displays a position of an observed and evaluated pattern and a deviation amount of the portion.

According to the method of evaluating the layer matching deviation based on the CAD information of the invention, the design CAD data is stored, the electron microscope image of the pattern of the semiconductor device formed on the wafer and the stored design CAD image are read, overlapped and displayed on the display, thereby, acceptability of formation of the pattern is evaluated and further, by displaying to overlap the pattern to be formed in the later step and design CAD image of other pattern related thereto, there is evaluated acceptability of formation of the pattern with regard to a relative relationship with the other pattern formed in the later step and therefore, the acceptability of the formation of the pattern in the respective fabricating step of the semiconductor can be confirmed at the respective step, improvement instruction at an early stage can be carried out for a defect and therefore, there is achieved a significant effect in promoting the yield. Early discovery can not only be reflected to improvement in forming an aimed pattern by correcting a mask or the like but also can be reflected to a change in design of a CAD diagram constituting a basis thereof, or the adjustment of a position of the other pattern formed in the later step and there can be expected a further effect in promoting the yield of the semiconductor device.

According to the apparatus of evaluating the layer matching deviation based on the CAD information of the invention, there is provided the means for sampling the contour segment from the microscope image in evaluating the acceptability of formation of the pattern by displaying the electron microscope image of the pattern of the semiconductor device formed on the wafer and the stored design CAD image to overlap on the display by reading the two images, the pattern image of the semiconductor device formed on the wafer, adopts the pattern contour line segment sampled by the contour line segment sampling means and therefore, there can easily be executed evaluation of the layer matching deviation based on the positioning and the CAD information in the field of vision of the microscope by comparing with the microscope image per se.

Further, in order to catch the pattern image of the predetermined portion at the center of the field of vision by the microscope having high magnification, by providing the navigation apparatus comprising the means for providing the low magnification microscope image by controlling the stage based on the position information, the means for calculating the deviation amount by the CAD line segment information and the matching processing on the low magnification microscope image and means for executing positioning of the stage based on the calculated deviation amount, the aimed pattern of the predetermined position can easily be caught as the microscope image having the high magnification.

What is claimed is:

1. An apparatus for evaluating a deviation between patterns that are successively formed on a wafer to fabricate a semiconductor device, comprising:
    a memory for storing CAD data used to form the successively formed patterns of the semiconductor device;
    a microscope for obtaining an image of an already formed one of the patterns on the semiconductor wafer;
    a monitor for displaying the image obtained with the microscope;
    means for reading first CAD data used to form the already formed pattern of the semiconductor device and reading second CAD data to be used to form another pattern of the semiconductor device that will be connected to the already formed pattern; and
    means for displaying the first and second CAD data with the displayed image of the already formed pattern as an overlapped image on the monitor to enable evaluation of a deviation of the already formed pattern from the first and second CAD data.

2. An apparatus for evaluating a deviation between patterns according to claim 1; wherein the microscope comprises a scanning microscope.

3. An apparatus for evaluating a deviation between patterns according to claim 1; wherein the successively formed pattern that will be connected to the already formed pattern comprises a pattern used to form a layer of material at least partially covering the already formed pattern.

4. An apparatus for evaluating a deviation between patterns according to claim 1; further comprising designating means for designating a desired region of the wafer containing a predetermined pattern, and low magnification pattern image acquiring means for acquiring low magnification pattern image data of the predetermined pattern from the image obtained by the microscope by controlling an observation position of the microscope so that a center of observation of the predetermined pattern falls in a predetermined observation field of view.

5. An apparatus for evaluating a deviation between patterns according to claim 4; further comprising means for sampling an edge of the predetermined pattern contained in the low magnification pattern image data and outputting edge line segment data.

6. An apparatus for evaluating a deviation between patterns according to claim 5; wherein the means for reading first and second CAD data comprises means for obtaining CAD line segment data.

7. An apparatus for evaluating a deviation between patterns according to claim 6; further comprising means for calculating a deviation amount between the center of observation of the microscope and a center of the predetermined observation field of view by comparing the CAD line segment data and the edge line segment data.

8. An apparatus for evaluating a deviation between patterns according to claim 7; further comprising means for controlling a position of a sample stage of the microscope such that the center of observation and the center of the predetermined observation field of view coincide with each other.

9. An apparatus for evaluating a deviation between patterns according to claim 1; further comprising a navigation apparatus having means for providing a low magnification image of the already formed pattern by controlling a sample stage of the microscope based on position information of the predetermined pattern, and means for calculating a deviation amount between the low magnification image of the already formed pattern and a CAD line segment image corresponding to the low magnification image of the predetermined pattern by performing a matching processing in order to locate the low magnification image of the already formed pattern at a center of a field of view of the microscope.

* * * * *